United States Patent
Kim et al.

(10) Patent No.: US 7,638,388 B2
(45) Date of Patent: Dec. 29, 2009

(54) METHOD OF FORMING A PATTERN AND METHOD OF MANUFACTURING A CAPACITOR USING THE SAME

(75) Inventors: Kyoung-Min Kim, Gyeonggi-do (KR); Jae-Ho Kim, Gyeonggi-do (KR); Young-Ho Kim, Gyeonggi-do (KR); Boo-Deuk Kim, Gyeonggi-do (KR); Seok Han, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 63 days.

(21) Appl. No.: 11/945,922

(22) Filed: Nov. 27, 2007

(65) Prior Publication Data

US 2008/0124911 A1  May 29, 2008

(30) Foreign Application Priority Data

Nov. 27, 2006  (KR) ................ 10-2006-017827

(51) Int. Cl.
*H01L 21/8244* (2006.01)
(52) U.S. Cl. ............... 438/238; 438/781; 526/328.5; 526/329.6; 526/329.7
(58) Field of Classification Search ........... 438/238; 526/328.5, 329.7
See application file for complete search history.

(56) References Cited

U.S. PATENT DOCUMENTS 6,486,283 B2 * 11/2002 Hong et al. ............ 526/328.5
6,548,613 B2 * 4/2003 Jung et al. ............. 526/329.6

FOREIGN PATENT DOCUMENTS

| KR | 2003-0056326 | 7/2003 |
|---|---|---|
| KR | 2004-0046704 | 6/2004 |
| KR | 2006-0035473 | 4/2006 |

OTHER PUBLICATIONS

Goldbach et al. ("Synthesis and Thin Film Characterization of Poly-(styrene-block-methyl methacrylate) Containing an Anthracene Dimer Photocleavable Junction Point" Macromolecules, vol. 35, pp. 4271-4276, 2002).*
English language abstract of Korean Publication No. 2003-0056326.
English language abstract of Korean Publication No. 2004-0046704.
English language abstract of Korean Publication No. 2006-0035473.

* cited by examiner

*Primary Examiner*—Charles D. Garber
*Assistant Examiner*—Yasser A Abdelaziez
(74) *Attorney, Agent, or Firm*—Harness, Dickey & Pierce

(57) ABSTRACT

In a method of forming a pattern and a method of manufacturing a capacitor using the same, a conductive layer is formed on a mold layer having an opening. A first buffer layer pattern including a polymer having a repeating unit of anthracene-methyl methacrylate and a repeating unit of alkoxyl-vinyl benzene is formed on the conductive layer in the opening. The first buffer layer pattern is baked to cross-link the polymers and form a second buffer layer pattern that is insoluble in a developing solution. The conductive layer on a top portion of the mold layer is selectively removed by using the second buffer layer pattern as an etching mask. Accordingly, a conductive pattern for a semiconductor device is formed. The method of forming a pattern may simplify manufacturing processes for a capacitor and a semiconductor device, and may improve their efficiencies.

20 Claims, 13 Drawing Sheets

ND OF MANUFACTURING A
METHOD OF FORMING A PATTERN AND METHOD OF MANUFACTURING A CAPACITOR USING THE SAME

CROSS-REFERENCE TO RELATED APPLICATIONS

This application claims priority under 35 U.S.C. § 119 to Korean Patent Application No. 2006-117827, filed on Nov. 27, 2006 in the Korean Intellectual Property Office (KIPO), the contents of which are herein incorporated by reference in the entirety.

BACKGROUND

1. Field of the Invention

Example embodiments of the present invention relate to a method of forming a pattern and a method of manufacturing a capacitor using the method of forming a pattern. More particularly, example embodiments of the present invention relate to a method of forming a pattern having a cylindrical shape and a method of manufacturing a capacitor using the method of forming a pattern.

2. Description of the Related Art

Generally, a capacitor employed in an electronic device, for example, a dynamic random access memory (DRAM) device, includes a lower electrode, a dielectric layer and an upper electrode. Recently, the area of a unit cell in DRAM devices has been reduced as integration of DRAM devices has been increased to have a giga-size. As the size of DRAM devices decreases, the capacitors in the cells of the DRAM devices have had to be modified to maintain the capacitance needed for optimum operation. In some instances, this modification has included modifying the shape of the capacitor. For example, capacitors that originally had a substantially flat shape have been modified to have a box shape or a cylindrical shape, which allows the capacitor to maintain a relatively large aspect ratio while having an overall size reduction.

The cylindrical capacitor typically includes a lower electrode having a cylindrical shape. A buffer layer pattern may be used in a node-separation process for forming the lower electrode having the cylindrical shape, and examples of a material that may be used for the buffer layer pattern may include an oxide, a photosensitive material, etc.

In order to form a buffer layer pattern including an oxide, the buffer oxide layer is formed through an oxide deposition process, where the buffer oxide layer is then etched through an etch-back process or chemical mechanical polishing process. Accordingly, forming the butter layer pattern requires a relatively long amount of time for the deposition process and the etching process. Additionally, a void may be formed in the buffer layer pattern. To prevent a void from forming in the buffer layer pattern, an atomic layer deposition process is required to form a buffer layer pattern.

In order to form the buffer layer pattern including a photosensitive material, a photoresist film is formed. After this photoresist film is formed, an exposing process, a developing process using a developing solution, a cleaning process, and a baking process are sequentially performed on the photoresist film. However, these processes require high cost exposure devices, which may increase the overall cost of forming the buffer layer pattern. Furthermore, the baking process that hardens the photoresist film typically requires a temperature of more than about 270° C. and also generally requires an ashing process to remove the hardened photoresist film.

However, the lower electrode of the buffer layer pattern may be damaged while the ashing process and the cleaning process are performed. Furthermore, buffer layer patterns are not easily removed by conventional and plasma ashing processes. In addition, residues of the buffer layer pattern remaining in an opening may serve as a resistance to cause malfunction of the capacitor. In order to improve the efficiency of the ashing process for removing the buffer layer pattern, an oxygen plasma ashing process may be performed at a high temperature of about 150° C. to about 250° C. However, the high temperature ashing process may deteriorate and/or oxidize the lower electrode so that the capacitor does not have a desired electric capacitance. These and other problems in the conventional art are addressed by embodiments of the present invention.

SUMMARY

Example embodiments of the present invention provide a method of forming a pattern of a semiconductor device using a buffer layer pattern including a polymer having a repeating unit of anthracene-methyl methacrylate and a repeating unit of alkoxyl-vinyl benzene.

Example embodiments of the present invention also provide a method of manufacturing method of a capacitor of a semiconductor device using the buffer layer pattern including the polymer.

According to one embodiment of the present invention, a method of forming a pattern includes forming a conductive layer having a substantially uniform thickness on a mold layer having an opening. A first buffer layer pattern including a polymer having a repeating unit of anthracene-methyl methacrylate and a repeating unit of alkoxyl-vinyl benzene is then formed on the conductive layer in the opening. The first buffer layer pattern is then baked to cross-link the polymers thereby forming a second buffer layer pattern that is insoluble in a developing solution. The conductive layer on a top portion of the mold layer is selectively removed by using the second buffer layer pattern as an etching mask. Accordingly, a conductive pattern for a semiconductor device is formed.

According to another embodiment of the present invention, a method of manufacturing a capacitor includes forming a mold layer on a substrate, the mold layer having an opening that exposes a conductive pattern on the substrate. A conductive layer having a substantially uniform thickness is formed on the bottom and sidewalls of the opening and on the mold layer. A first buffer layer pattern including a first polymer having a repeating unit of anthracene-methyl methacrylate and a repeating unit of alkoxyl-vinyl benzene is formed on the conductive layer to fill the opening. The first buffer layer pattern is then baked to cross-link the first polymers thereby forming a second buffer layer pattern that is insoluble in a developing solution. The conductive layer on a top portion of the mold layer is selectively etched by using the second buffer layer pattern as an etching mask to form a lower electrode electrically connected to the conductive pattern. The mold layer is then removed, and the second buffer layer pattern is exposed to light to convert the second buffer layer pattern into a third buffer layer pattern including a second polymer having the repeating unit of anthracene-methyl methacrylate and a repeating unit of hydroxyl-vinyl benzene, the second polymer being soluble in a developing solution. The third buffer layer pattern is then removed by using the developing solution. A dielectric layer is formed on the substrate having the lower electrode and an upper electrode is formed on the dielectric layer Thus, according to some embodiments of the present invention, the buffer layer including the first polymer is partially removed using a developing solution to form a first buffer layer pattern. The first buffer layer pattern is changed to a second buffer layer pattern having an etching resistance through the baking process. The second buffer layer pattern may then be used as an etching mask, after which time the second buffer layer pattern may be changed to the third buffer layer pattern being soluble in the developing solution through an exposing process. Accordingly, the third buffer layer pattern may be entirely removed without an ashing process. Thus, the method of forming a pattern may simplify manufacturing processes for a semiconductor device and a capacitor, and may improve their efficiencies.

BRIEF DESCRIPTION OF THE DRAWINGS

The above and other features and advantages of the present invention will become more apparent by describing example embodiments thereof with reference to the accompanying drawings, in which.

DETAILED DESCRIPTION

Figure 1:
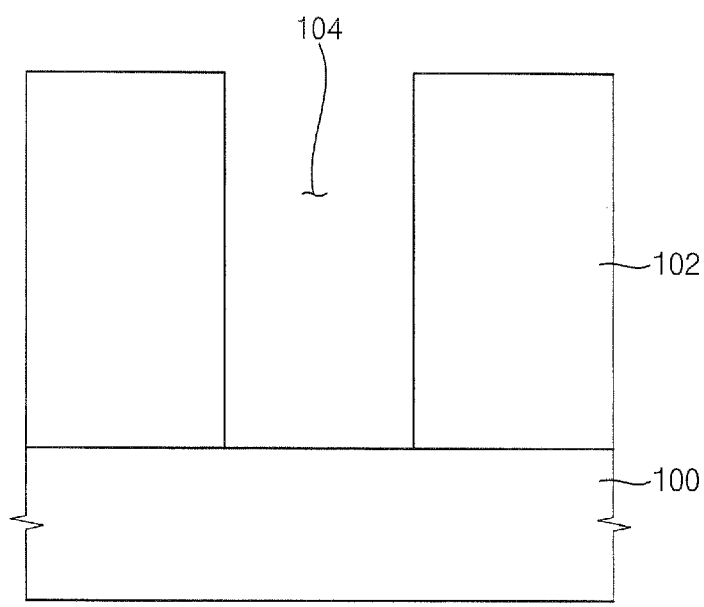
FIGS. 1 through 7 are cross-sectional views illustrating a method of forming a pattern according to example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected, or coupled to the other element or layer, or intervening elements or layers may be present. In contrast, when an element is referred to as being "directly on," "directly connected to," or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations accordingly, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Forming a Pattern

FIGS. 1 through 7 are cross-sectional views illustrating a method of forming a pattern according to an example embodiment of the present invention.

Referring to FIG. 1, an insulation pattern 102 is formed on a substrate 100. The insulation pattern 102 has an opening 104 to expose a portion of an upper surface of the substrate 100.

Examples of the substrate 100 may include a silicon substrate having an insulating interlayer and a contact pad passing through the insulating interlayer. The insulating pattern may be formed, for example, by depositing an insulation material on the substrate 100 to form an insulation layer and patterning the insulation layer to form the insulation pattern 102 on the substrate 100. Examples of a material that may be used for the insulation layer may include an oxide such as borophosphosilicate glass (BPSG), phosphosilicate glass (PSG), undoped silicate glass (USG), spin-on glass (SOG), plasma-enhanced tetraethylorthosilicate (PE-TEOS), or the like.

In the example embodiment, the insulation layer may have a thickness of about 5,000 Å to about 20,000 Å from the upper surface of the substrate 100. The thickness of the insulation layer may vary depending on a desired thickness of a conductive pattern since the thickness of the conductive pattern formed after the insulation layer depends on the thickness of the insulation layer.

In the pattering process of the insulation layer, a mask pattern (not shown) may be formed on the insulation layer. The mask pattern includes a material having a high etching selectivity with respect to the insulation layer. Examples of the mask material may include silicon nitride, silicon oxide nitride, or the like. The insulation layer exposed through the mask pattern is etched to expose the upper surface of the substrate 100.

For example, the insulation layer may be wet-etched using an LAL etching solution including deionized water, ammonium hydrofluoride, and hydrofluoric acid to form the insulation pattern 102. Alternatively, the insulation layer may be dry-etched using an etching gas including hydrofluoric acid anhydride, isopropyl alcohol, and/or water vapor to form the insulation pattern 102. Before the insulation layer is formed, an etch stop layer (not shown) may be further formed on the substrate 100 to prevent damage of the substrate 100 when the insulation pattern 102 having the opening 104 is formed.

Figure 2:
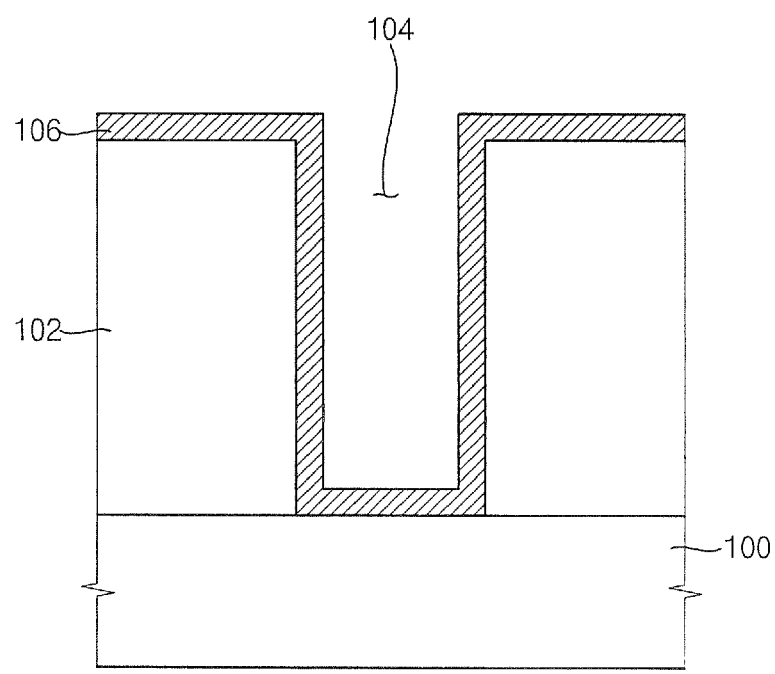

Referring to FIG. 2, a conductive layer 106 is formed on the insulation pattern 102 and on a bottom and sidewalls of the opening 104.

For example, a conductive material may be deposited in the opening 104 and on the insulation pattern 102 to form the conductive layer 106 having a substantially uniform thickness. Examples of the conductive material may include polysilicon, tungsten (W), titanium (Ti), titanium nitride (TiN), tungsten nitride (WN), or the like. These may be used alone or in a combination thereof. When a single conductive material is used, the conductive layer 106 may have a single-layered structure. When a combination of the conductive materials is used, the conductive layer 106 may have a multiple-layered structure. In the example embodiment, the conductive layer 106 has a multiple-layered structure including a titanium layer and a titanium nitride layer that are sequentially formed.

Figure 3:
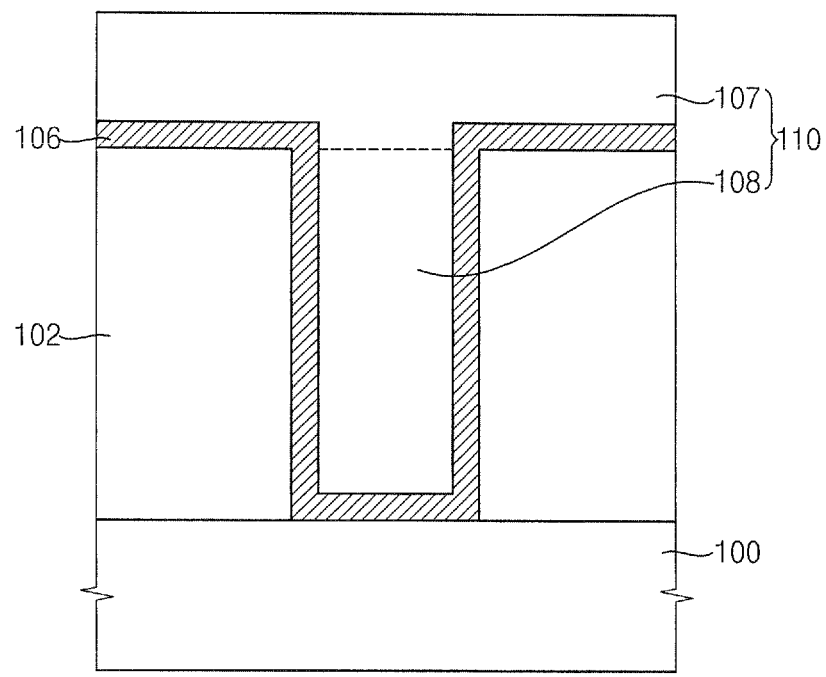

Referring to FIG. 3, a buffer layer 110 including a first polymer is formed to fill the opening 104 having the conductive layer 106 and to cover the conductive layer 106 on the insulation pattern 102.

The first polymer includes a repeating unit of anthracene-methyl methacrylate and a repeating unit of alkoxyl-vinyl benzene. The first polymer may be represented by the following Chemical Formula 1. The first polymers have a linear shape and are not cross-linked with each other. Additionally, the first polymers are soluble in a developing solution.

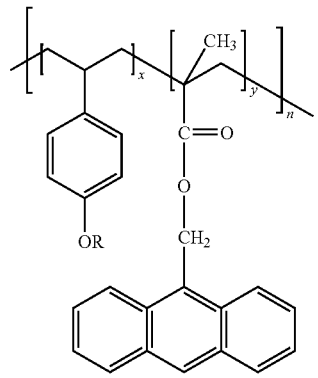

<Chemical Formula 1>

In Chemical Formula 1, R represents an alkyl group having carbon atoms of 1 to 5. For example, R may represent a tert-butyl group. Furthermore, a ratio of y:x may be about 1:0.8 to about 1:1.2, and may be preferably about 1:1. n is a natural number.

When the number-average molecular weight of the first polymer is more than about 6,000, the buffer layer 110 may not fill the opening sufficiently. When the number-average molecular weight of the first polymer is less than about 3,000, an etching-resistance of a second buffer layer pattern 112 (see FIG. 4) formed through a subsequent baking process may be reduced. Thus, the number-average molecular weight may be about 3,000 to about 6,000, and may be preferably about 4,000 to about 5,000.

The mole ratio of the repeating unit of anthracene-methyl methacrylate to the repeating unit of alkoxyl-vinyl benzene may be about 1:0.8 to about 1:1.2. For example, the first polymer may include about 45% to about 55% by mole of the repeating unit of anthracene-methyl methacrylate and about 55% to about 45% by mole of the repeating unit of alkoxyl-vinyl benzene.

Examples of the repeating unit of anthracene-methyl methacrylate may include (anthracene-9-yl)methyl methacrylate, and examples of the repeating unit of alkoxyl-vinyl benzene may include 1-tert-butoxy-4-vinylbenzene.

The repeating unit of anthracene-methyl methacrylate may allow the first polymer to have light-absorption and insolubility in an alcohol such as isopropyl alcohol. When the content of the repeating unit of anthracene-methyl methacrylate is less than about 45% by mole, the light-absorption of the buffer layer 110 may be reduced. In contrast, when the content of the repeating unit of anthracene-methyl methacrylate is more than about 55% by mole, a solubility of a third buffer layer 110 formed through a subsequent exposing process may be reduced. Thus, the first polymer may include about 45% to about 55% by mole of the repeating unit of anthracene-methyl methacrylate, and may preferably include about 50% by mole of the repeating unit of anthracene-methyl methacrylate.

The repeating unit of alkoxyl-vinyl benzene may allow the first polymer to be reacted with an acid to form a second polymer including a repeating unit of hydroxyl-vinyl benzene. When the content of the repeating unit of alkoxyl-vinyl benzene is less than about 45% by mole, the solubility of the third buffer layer formed after the exposing process may be reduced. When the content of the repeating unit of alkoxyl-vinyl benzene is more than about 55% by mole, the light-absorption of the buffer layer 110 may be reduced. Thus, the first polymer may include about 45% to about 55% by mole of the repeating unit of alkoxyl-vinyl benzene, and may preferably include about 50% by mole of the repeating unit of alkoxyl-vinyl benzene.

The buffer layer 110 may be coated on the substrate by, for example, spin coating a composition for the buffer layer 110, which includes the first polymer, on the substrate 100 to form the buffer layer 110. The composition for a buffer layer may include about 2% to about 6% by weight of the first polymer having the repeating unit of anthracene-methyl methacrylate and the repeating unit of alkoxyl-vinyl benzene, about 0.01% to about 0.1% by weight of a non-ionic polyoxyethylene surfactant, about 0.001% to about 0.1% by weight of a cross-linking agent, and a remainder of an organic solvent. The first polymer may be presented by following Chemical Formula 1. The composition may further include about 0.001% to about 0.01% by weight of a cross-linking stabilizer.

When the content of the first polymer is more than about 6% by weight or less than about 2% by weight, the thickness of the buffer layer may not be uniform. Furthermore, the buffer layer may not be uniformly cured so that the buffer layer has defects therein. Thus, the composition for a buffer layer may include about 2% to about 6% by weight of the first polymer, and may preferably include about 4% by weight of the first polymer.

The non-ionic surfactant may include at least one non-ionic polyoxyethylene surfactant. Examples of the non-ionic polyoxyethylene surfactant may include polyoxyethylene lauryl ether, polyoxyethylene cetyl ether, polyoxyethylene oleyl ether, polyoxyethylene sorbitan monolaurate, polyoxyethylene isooctylphenyl ether or the like. These may be used alone or in a combination thereof. Furthermore, examples of the non-ionic surfactant may include a conventional non-ionic surfactant known to those skilled in the art. Thus, any further explanation concerning the non-ionic surfactant will be omitted.

The organic solvent may control the viscosity of the composition so that the composition has characteristics suitable for a spin coating method. Examples of the organic solvent may include an alcohol. Furthermore, examples of the organic solvent may include an organic solvent soluble in water. Particularly, examples of the organic solvent may include methanol, ethanol, butanol, propanol, isopropyl alcohol, n-butanol, 1-methoxy-2-propanol, methoxypropylacetate, propylene glycol monomethylether acetate, propylene glycol monomethylether, isobutyl alcohol, t-butyl alcohol, or the like. These may be used alone or in a combination thereof.

For example, the organic solvent may include propylene glycol monomethyl ether acetate and propylene glycol monomethyl ether in a weight ratio of about 8:2. Since the content of the organic solvent in the composition may vary such that the composition is capable of being coated through a spin coating method, the content of the organic solvent may not be limited to a specific range.

For example, the composition for a buffer layer may further include about 0.001% to about 0.1% by weight of the cross-linking agent. Examples of the cross-linking agent may include melamine resin or the like. Furthermore, examples of the cross-linking agent may include a conventional cross-linking agent known to those skilled in the art. Thus, any further explanation concerning the cross-linking agent will be omitted.

The buffer layer 110 may include an upper buffer layer 107 and a lower buffer layer 108. The upper buffer layer 107 may be removed through a developing process using a developing solution, and the lower buffer layer 108 may remain in the opening 104 after the developing process.

Figure 4:
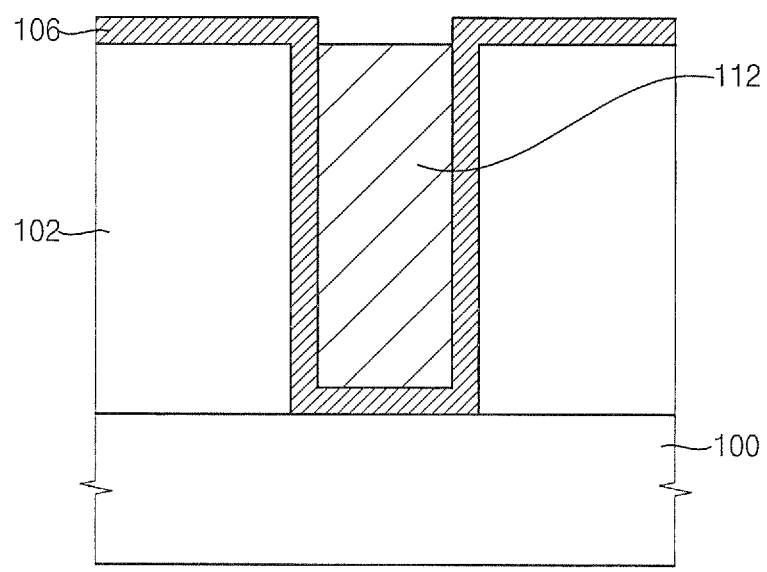

Referring to FIG. 4, a first buffer layer pattern is formed in the opening 107. The first buffer layer pattern corresponds to the lower buffer layer 108. Since the buffer layer 110 includes the first polymer soluble in the developing solution, the upper buffer layer 107 may be easily moved through the developing process. Examples of the developing solution may include hydroxyl ammonium compound such as hydroxyl tetramethylammonium. For example, the developing solution may include about 2% to about 4% by weight of hydroxyl tetramethylammonium and a remainder of water.

The first polymers in the first buffer layer pattern are cross-linked through a baking process to form the second buffer layer pattern 112. For example, the first buffer layer in the opening 104 may be cured at a temperature of about 150° C. to about 250° C. to form the second buffer layer pattern 112. The baking temperature may be preferably about 200° C. to about 250° C., and may be more preferably about 220° C. to about 250° C. The second buffer layer pattern 112 includes the first polymers cross-linked with each other so that the second buffer layer pattern 112 has a high etching-resistance. Thus, damage to the conductive layer 106 disposed in the opening 104 may be prevented in the course of removing a portion of the conductive layer 106.

Furthermore, the second buffer layer pattern 112 is not dissolved in a subsequent cleaning process since the second buffer layer pattern 112 is insoluble in an LAL solution, isopropyl alcohol, water, or the like. Since the first polymer cross-linked in the second buffer layer pattern 112 is fully explained above, further explanation concerning the first polymer will be omitted.

Figure 5:
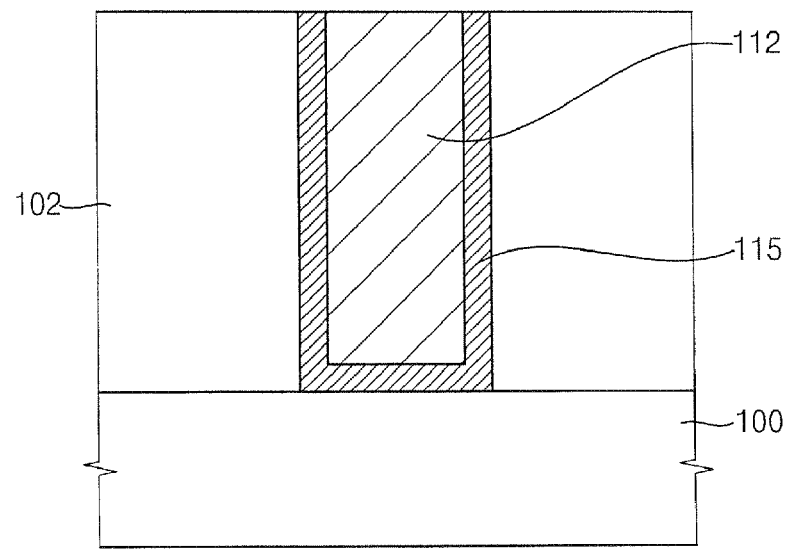

Referring to FIG. 5, the conductive layer 106 disposed on the upper surface of the insulation pattern 102 is etched by using the second buffer layer pattern 112 as an etching mask.

For example, the conductive layer 106 disposed on the upper surface of the insulation pattern 102 is etched using the second buffer layer pattern 112 as a mask to expose the upper surface of the insulation pattern 102. Thus, a remaining conductive layer 106 forms a conductive layer pattern 115 having a cylindrical shape and making contact with an inner wall of the insulation pattern 102, which surrounds the opening 104. The second buffer layer pattern 112 is insoluble in the developing solution. Thus, damage to the conductive layer pattern 115 may be prevented when the conductive layer 106 is etched.

After the conductive layer pattern 115 is formed, a cleaning process may be further performed to remove any etching residue remaining on the insulation pattern 102 and the conductive layer pattern 115. For example, the cleaning process may be performed by using isopropyl alcohol, deionized water, or the like.

Figure 6:
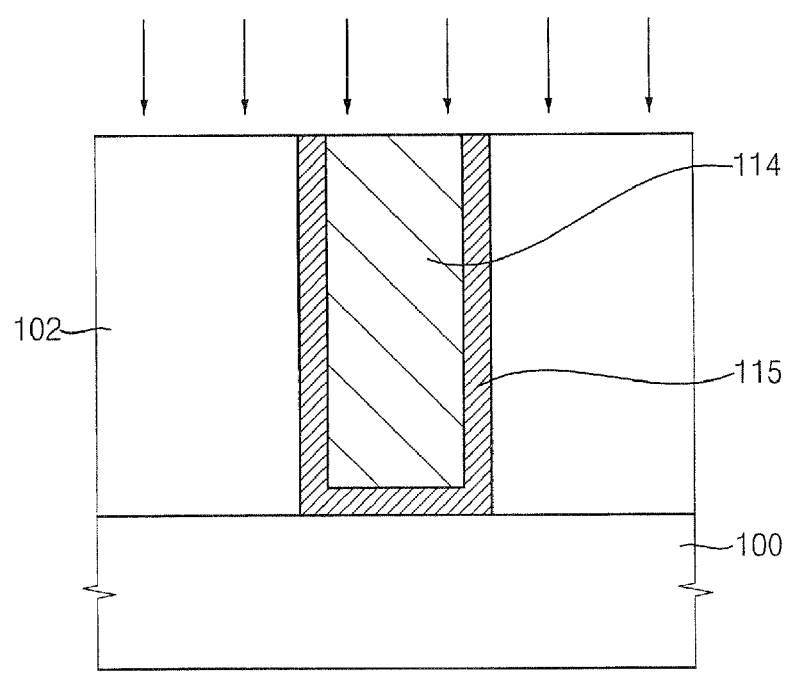

Referring to FIG. 6, a third buffer layer pattern 114 is formed. The third buffer layer pattern 114 includes the second polymer being soluble in the developing solution and having the repeating unit of anthracene-methyl methacrylate and a repeating unit of hydroxyl-vinyl benzene.

For example, the first polymer in the second buffer layer pattern 112 may be reacted with an acid generated by light to form the second polymer so that the third buffer layer pattern 114 is formed. When the second buffer layer pattern 112 is exposed to light, an acid, such as H+, is generated in the second buffer layer pattern 112. The acid is reacted with an alkoxyl group of the repeating unit of alkoxyl-vinyl benzene in the first polymer. Thus, the repeating unit of alkoxyl-vinyl benzene is changed into the repeating unit of hydroxyl-vinyl benzene. As a result, the first polymer is changed into the second polymer having the repeating unit of anthracene-methyl methacrylate and the repeating unit of hydroxyl-vinyl benzene. The second polymer may be represented by following Chemical Formula 2.

<Chemical Formula 2>

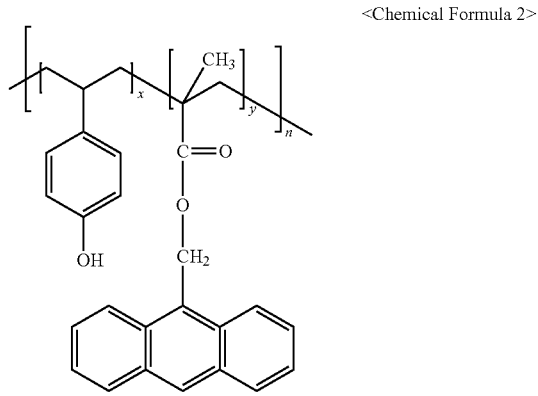

In Chemical Formula 2, a ratio of y:x is about 1:0.8 to about 1:1.2, and n is a natural number.

Figure 7:
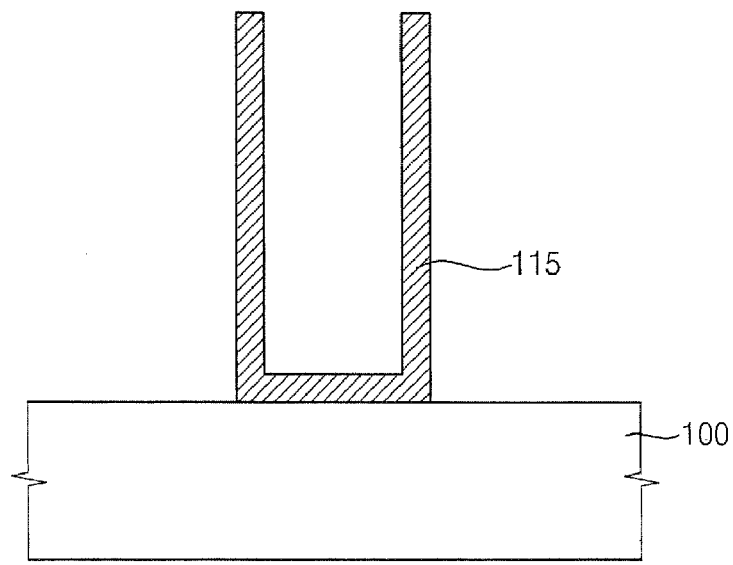

Referring to FIG. 7, the insulation pattern 102 on the substrate 100 and the third buffer layer pattern 114 surrounded by the conductive layer pattern 115 are sequentially removed. For example, the insulation pattern 102 may be removed from the substrate 100 through a wet-etching process using an etching solution. When the insulation pattern 102 includes an oxide, the etching solution may be LAL solution including water, hydrofluoric acid, and ammonium hydrofluoride.

Thereafter, the third buffer layer pattern 114 surrounded by the conductive layer pattern 115 is removed through a second developing process using a developing solution. Accordingly, the conductive layer pattern 115 disposed on the substrate 100 is completed, and a sidewall of the conductive layer pattern 115 is exposed. For example, the developing solution may include about 2.4% by weight of hydroxyl tetramethylammonium and a remainder of water. The method of forming a pattern according to example embodiments of the present invention may be variously used in a method of forming a cylindrical shaped pattern of a semiconductor device. A method of manufacturing a capacitor of a semiconductor is described more fully hereinafter.

Method of Manufacturing a Capacitor of a Semiconductor Device

FIGS. 8 through 17 are cross-sectional views illustrating a method of manufacturing a capacitor of a semiconductor device according to example embodiments of the present invention.

Figure 8:
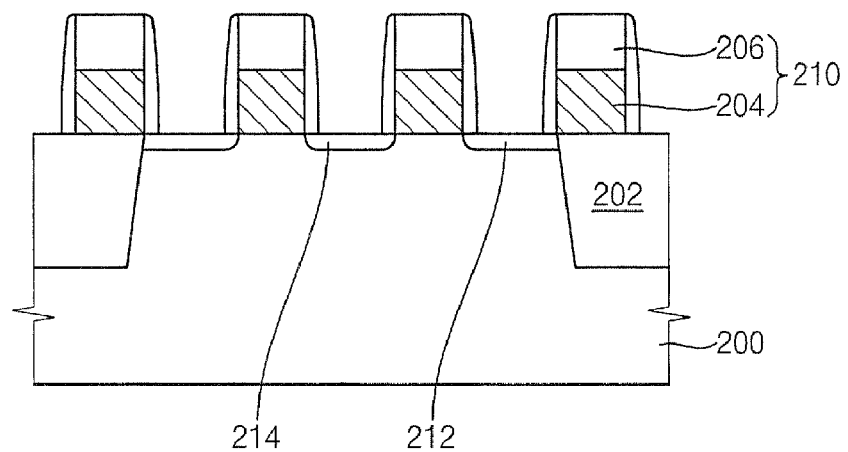
FIGS. 8 through 17 are cross-sectional views illustrating a method of manufacturing a capacitor of a semiconductor device according to example embodiments of the present invention.

Referring to FIG. 8, an isolation layer 202 is formed at an upper portion of a substrate 200, for example, a semiconductor substrate, through a shallow trench isolation (STI) process to divide the substrate 200 into an active region and a field region.

Thereafter, a gate insulation layer is formed on the substrate 200 having the isolation layer 202 through, for example, a heat oxidation process, a chemical vapor deposition (CVD) process, an atomic layer deposition process, or the like. Examples of a material that may be used for the gate insulation layer may include silicon oxide ($SiO_2$), a material having a dielectric constant substantially higher than that of silicon oxide, or the like.

A first conductive layer and a gate mask 206 are sequentially formed on the gate insulation layer. The first conductive layer may include polysilicon, into which impurities are doped. The first conductive layer may be patterned to form a gate electrode 204 through the following processes. The first conductive layer may have a multi-layered structure including a doped polysilicon layer and a metal layer, which are sequentially formed.

The gate mask 206 may include a material having a high etching selectivity with respect to a first insulating interlayer (not shown). For example, when the first insulating interlayer includes an oxide, such as silicon oxide, the gate mask 206 may include a nitride, such as silicon nitride.

Thereafter, the first conductive layer and the gate insulation layer are sequentially patterned by using the gate mask 206 as an etching mask. Thus, a plurality of gate structures 210, each of the gate structures including a gate insulation pattern (not shown), a gate electrode 204 and the gate mask 206, is formed on the substrate 200.

Thereafter, a silicon nitride layer is formed on the substrate 200 having the gate structures 210, and then anisotropically etched to form a gate spacer at both sidewalls of each of the gate structures 210.

Impurities are implanted into the substrate 200 exposed between the gate structures 210 through an ion implantation process by using the gate structures 210 having the gate spacer as a mask. Thereafter, a first contact region 212 and a second contact region 214, which correspond to a source/drain region, are formed on the substrate 200 through a heating process. The first contact region 212 corresponds to a capacitor contact region making contact with a first pad 222 (see FIG. 9), and the second contact region 214 corresponds to a bit line contact region making contact with a second pad 224 (see FIG. 9).

Accordingly, a plurality of transistors, each of the transistors including the gate structure 210, the first contact region 212, and the second contact region 214, is formed on the substrate 200.

Figure 9:
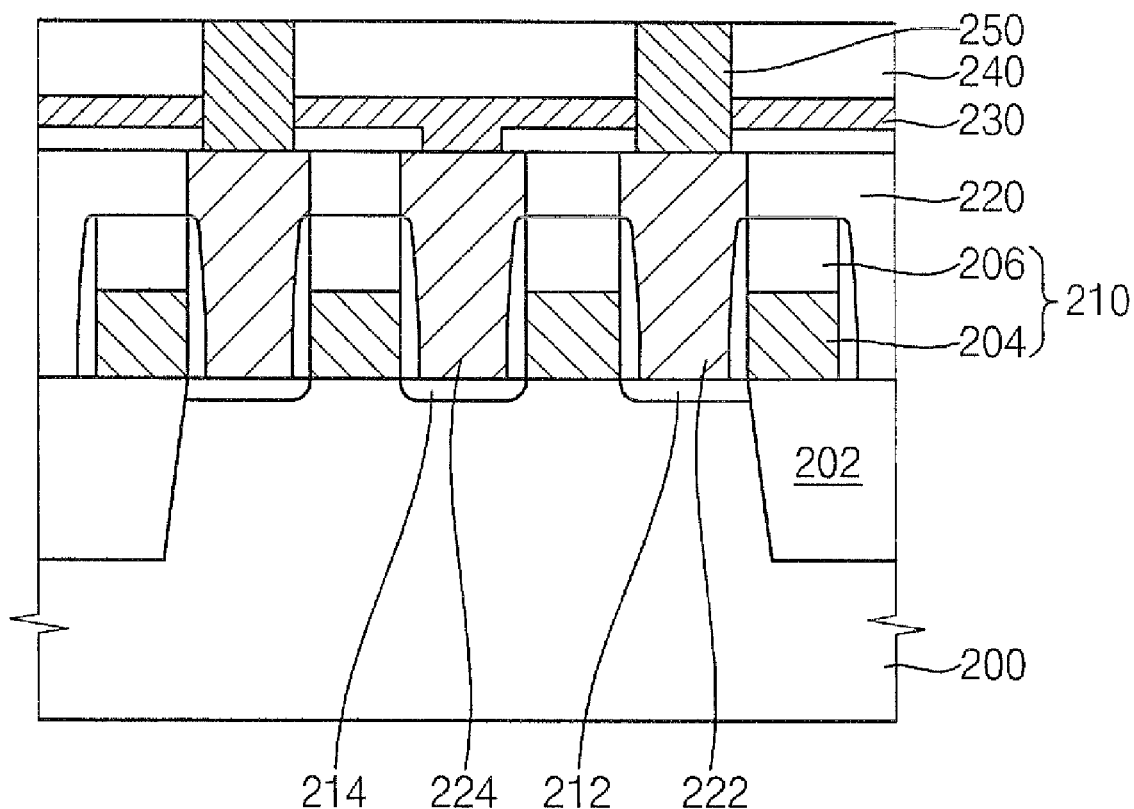

Referring to FIG. 9, a first insulating interlayer 220 is formed on the substrate 200. The first insulating interlayer 220 covers the transistor and includes an oxide. Examples of a material that may be used for the first insulating interlayer 220 may include BPSG, PSG, USG, SOG, PE-TEOS, high-density plasma chemical vapor deposition (HDP-CVD) oxide, or the like. The first insulating interlayer 220 may be formed through a CVD process, a plasma-enhanced chemical vapor deposition (PECVD) process, a high-density plasma chemical vapor deposition (HDP-CVD) process, an atomic layer deposition process, or the like.

Thereafter, an upper portion of the first insulating interlayer 220 is removed through a chemical mechanical polishing (CMP) process to planarize an upper surface of the first insulating interlayer 220. In the example embodiment, the first insulating interlayer 220 has a predetermined thickness from an upper surface of the gate mask 206.

A second photoresist pattern (not shown) is formed on the first insulating interlayer 220. Thereafter, the first insulating interlayer 220 is partially anisotropically etched using the second photoresist pattern as an etching mask to form a plurality of first contact holes through the first insulating interlayer 220. The first contact holes expose the first contact region 212 and the second contact region 214. A portion of the first contact holes exposes the first contact region 212 corresponding to the capacitor contact region. A remainder of the first contact holes exposes the second contact region 214 corresponding to the bit line contact region.

The second photoresist pattern is removed through an ashing process and/or a stripping process. A second conductive layer is formed to fill the first contact holes and to cover the first insulating interlayer 220. Examples of a material that may be used for the second conductive layer may include polysilicon into which impurities are doped at a high concentration, a metal, a conductive metal nitride, or the like.

The second conductive layer is partially removed through a CMP process and/or an etch-back process until the upper surface of the first insulating interlayer 220 is exposed. Thus, a first pad 222 and a second pad 224 are formed in the first contact holes. The first pad 222 is electrically connected to the capacitor contact region, and the second pad 224 is electrically connected to the bit line contact region.

A second insulating interlayer (not shown) is formed on the first insulating interlayer 220 having the first pad 222 and the second pad 224. The second insulating interlayer may serve to electrically separate the first pad 222 from a bit line formed through following processes.

Thereafter, a CMP process is performed to planarize an upper portion of the second insulating interlayer. A third photoresist pattern (not shown) is formed on the planarized second insulating interlayer. The second insulating interlayer is partially etched by using the third photoresist pattern as an etching mask to form a second contact hole (not shown) through the second insulating interlayer. The second contact hole exposes the second pad 224. The second contact hole corresponds to a bit line contact hole for electrically connecting the second pad 224 to the bit line.

The third photoresist pattern is removed through an ashing process and/or a stripping process. A third conductive layer is formed on the second insulating interlayer. The third conductive layer fills the second contact hole.

The third conductive layer is patterned to form a bit line 230 electrically connected to the second pad 224. The bit line 230 may include a first layer and a second layer. The first layer may include a metal and a metal oxide, and the second layer may include a metal. For example, the first layer may include titanium/titanium nitride (Ti/TiN), and the second layer may include tungsten (W).

Thereafter, a third insulating interlayer 240 is formed to cover the second insulating interlayer having the bit line 230. Examples of a material that may be used for the third insulating interlayer 240 may include BPSG, PSG, USG, SOG, PE-TEOS, HDP-CVD oxide, or the like.

A fourth photoresist pattern (not shown) is formed on the third insulating interlayer 240. The second insulating interlayer and the third insulating interlayer 240 are partially etched by using the fourth photoresist pattern as an etching mask to form a plurality of third contact holes exposing the first pad 222. A contact pad of a capacitor may be formed in each of the third contact holes.

A fourth conductive layer is formed on the third insulating interlayer 240. The fourth conductive layer fills the third contact holes. A CMP process is performed to form a third pad 250 in each of the third contact holes. Examples of a material that may be used for the third pad 250 may include polysilicon, into which impurities are doped. The third pad 250 may serve to connect the first pad 222 to a lower electrode formed through subsequent processes.

Figure 10:
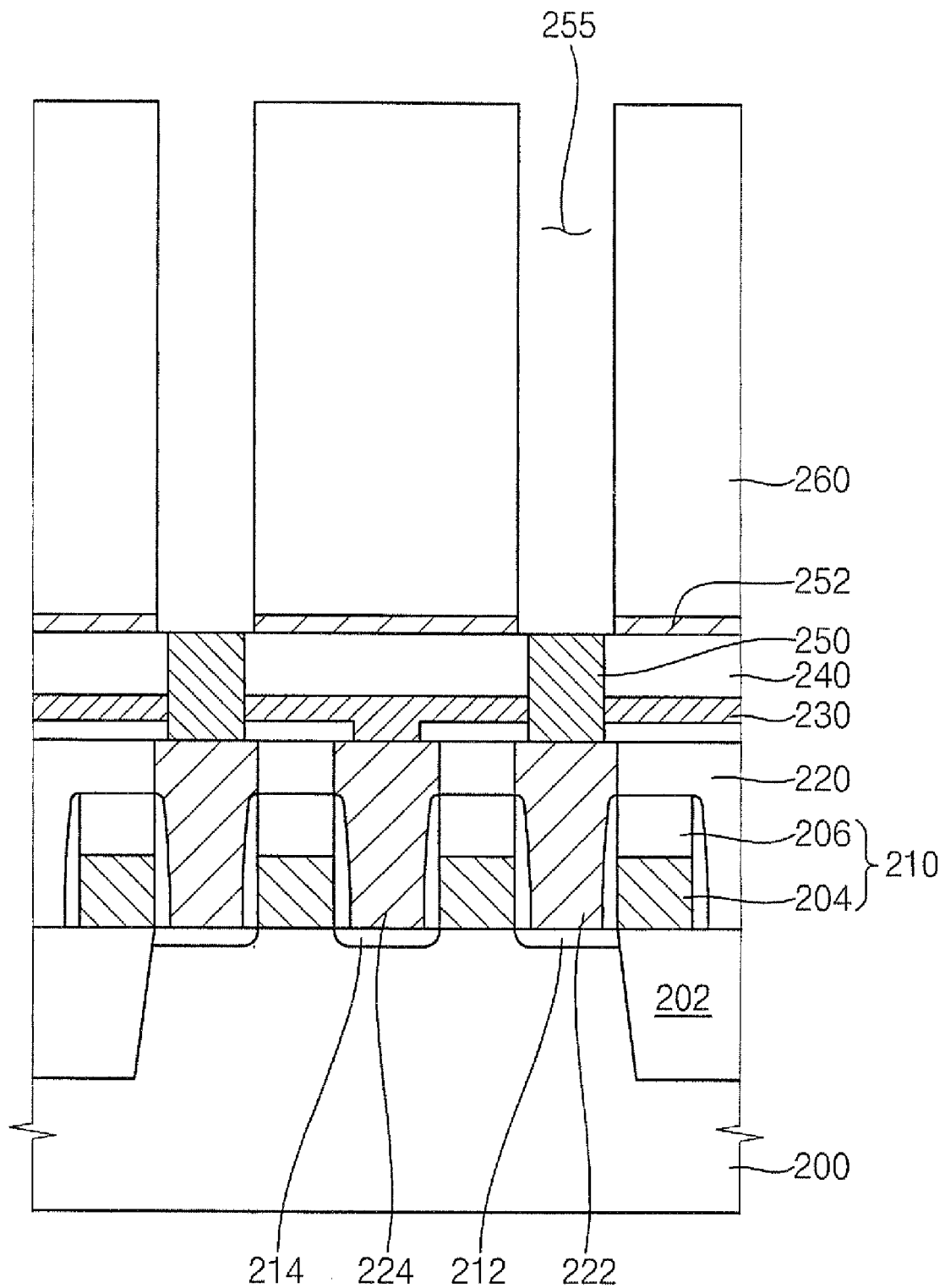

Referring to FIG. 10, an etch stop layer 252 is formed on the third pad 250 and on the third insulating interlayer 240. For example, the etch stop layer 252 may serve to protect the third pad 250 when a mold layer 260 is selectively etched through subsequent processes to form an opening 255 through the mold layer 260. The thickness of the etch stop layer 252 may be about 10 Å to about 200 Å. The etch stop layer 252 may include a material having a low etching selectivity with respect to the mold layer 260, for example, a nitride, a metal oxide, or the like.

The mold layer 260 is formed on the etch stop layer 252. Examples of a material that may be used for the mold layer 260 may include silicon oxide. Particularly, examples of a material that may be used for forming the mold layer 260 may include BPSG, PSG, USG, SOG, TEOS, HDP-CVD oxide, or the like. The mold layer 260 may have a double-layered structure formed by depositing the materials. When the mold layer 260 has a double-layered structure including at least two layers having different etching ratios, the shape of a sidewall of a lower electrode of a capacitor, which is formed through subsequent processes, may be changed.

The thickness of the mold layer 260 may vary depending on a desired capacitance of the resulting capacitor. Since the height of a capacitor depends on the thickness of the mold layer 260, the thickness of the mold layer 260 may vary so as to form a capacitor having a desired capacitance.

Thereafter, the mold layer 260 and the etch stop layer 252 are partially etched to form an opening 255 to expose the third contact 250. When the opening 255 is formed, the etch stop layer 252 may be over-etched to entirely remove the etch stop layer 252 on a bottom of the opening 255. Thus, an upper portion of the third contact 250 may be partially etched when the etch stop layer 252 is etched.

Figure 11:
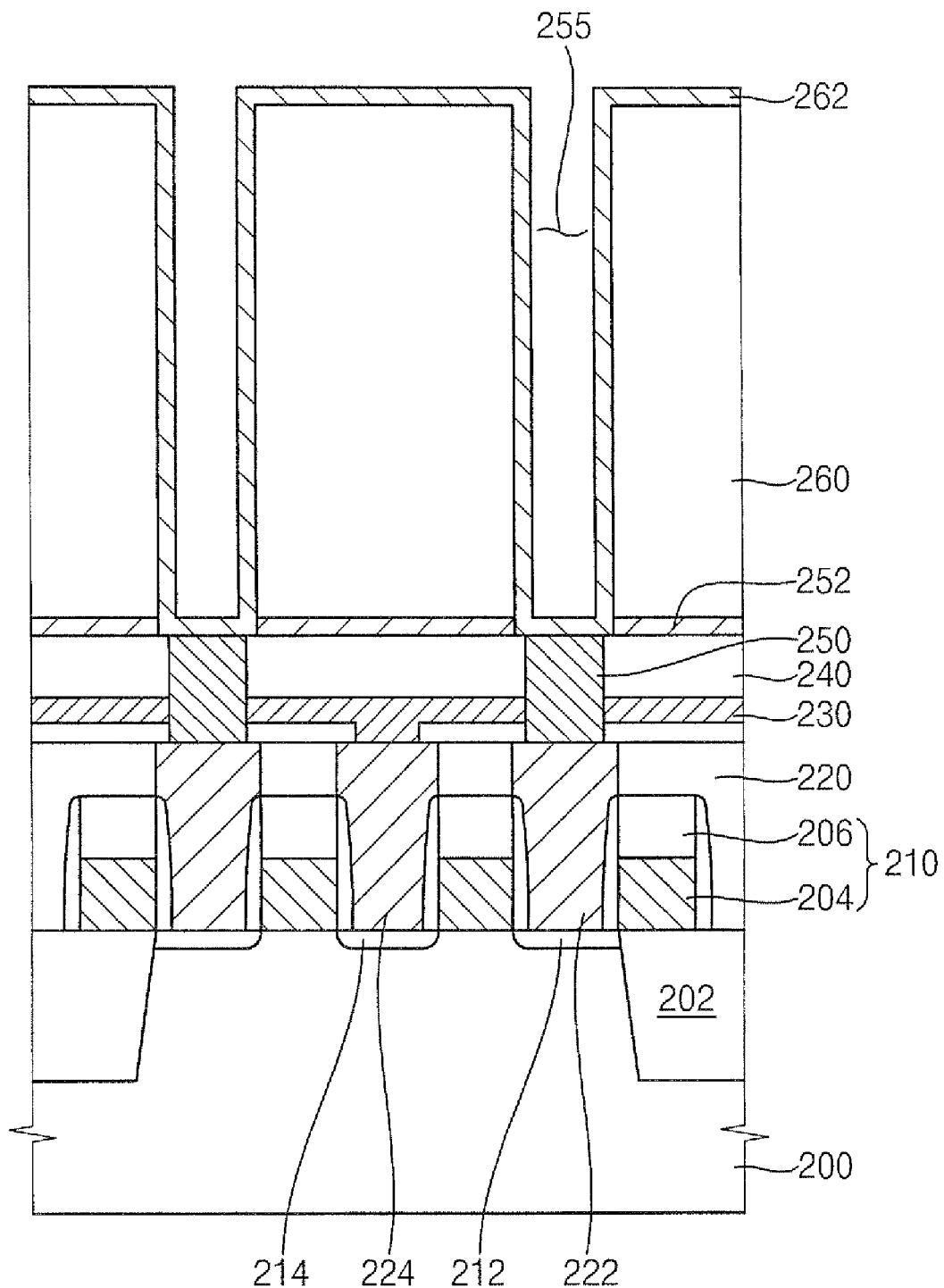

Referring to FIG. 11, a conductive layer 262 for a lower electrode is continuously formed on the sidewall and the bottom of the opening 255 and on the mold layer 260. The conductive layer 262 may include a material different from the third contact 250. For example, the conductive layer 262 may include a metal, a metal-containing material, or the like. Particularly, examples of a material that may be used for the conductive layer 262 may include titanium, titanium nitride, or the like. The conductive layer 262 may have a multiple-layered structure. For example, the conductive layer 262 may have a double-layered structure including a titanium layer and a titanium nitride layer.

As explained above, when the conductive layer 262 does not include polysilicon but includes a metal, a metal-containing material, or the like, a depletion layer is not formed at an interface between a lower electrode and a dielectric layer, which are formed through subsequent processes. Thus, a capacitance of a capacitor may be increased.

Since the conductive layer 262 is formed on an inner surface of the opening having a relatively high aspect ratio, the conductive layer 262 may be preferably formed through a deposition method having relatively good step-coverage characteristics. The conductive layer 262 may have a relatively thin thickness so as not to entirely fill the opening 255. The conductive layer 262 may be formed through, for example, a CVD process, a cyclic CVD process, an atomic layer deposition process, or the like.

Figure 12:
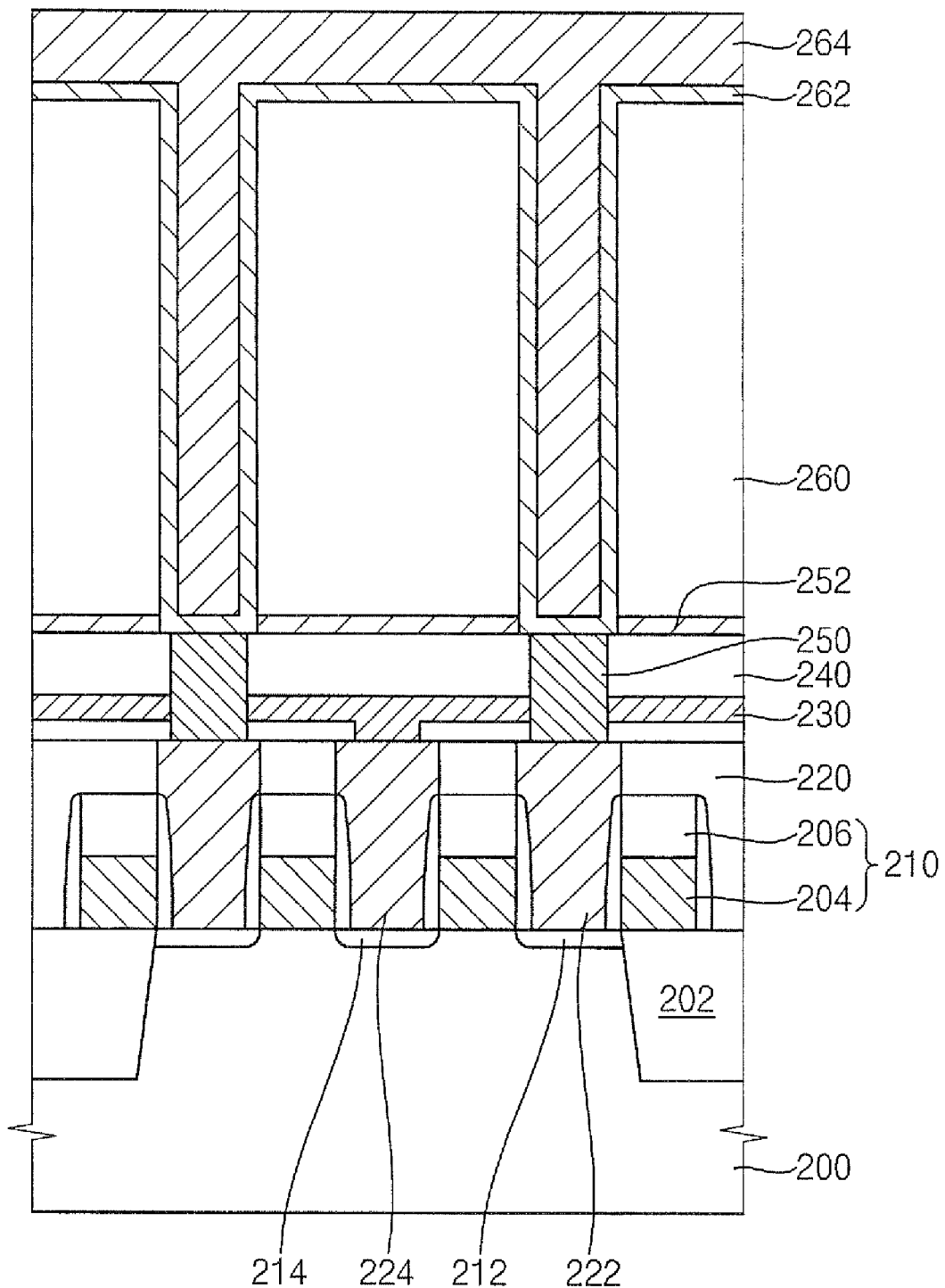

Referring to FIG. 12, the buffer layer 264 is formed to fill the opening 255 and to cover the conductive layer 264.

For example, the buffer layer 264 may be formed by coating a composition including about 2% to about 6% by weight of a first polymer having the repeating unit of anthracene-methyl methacrylate and the repeating unit of alkoxyl-vinyl benzene, about 0.001% to about 0.1% by weight of a nonionic polyoxyethylene surfactant, about 0.001% to about 0.1% by weight of a cross-linking agent, and a remainder of an organic solvent. Thus, the buffer layer 264 may include the first polymer having a linear shape.

The first polymer may be presented by following Chemical Formula 1. The polystyrene-reduced weight average molecular weight of the first polymer may be about 7,000 to about 10,000. The number average molecular weight of the first polymer may be about 3,000 to about 6,000. Furthermore, the first polymer may include about 45% to about 55% by mole of the repeating unit of anthracene-methyl methacrylate and about 55% to about 45% by mole of the repeating unit of alkoxyl-vinyl benzene. The first polymer and the composition are substantially the same as the above-explained first polymer and the above-explained composition. Thus, any further explanations in these regards will be omitted.

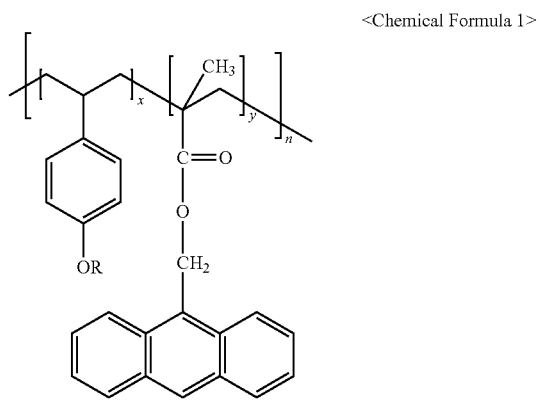

<Chemical Formula 1>

The buffer layer 264 in the example embodiment includes the first polymer soluble in a developing solution. Thus, the buffer layer 264 may be removed through a first developing process without an exposing process. As a result, a high-cost exposing device may not be required. Furthermore, when the buffer layer is heated, the first polymers are cross-linked to cure the buffer layer and to form an insoluble buffer layer. The insoluble buffer layer is insoluble in water and isopropyl alcohol, which are used in subsequent cleaning and drying processes.

Figure 13:
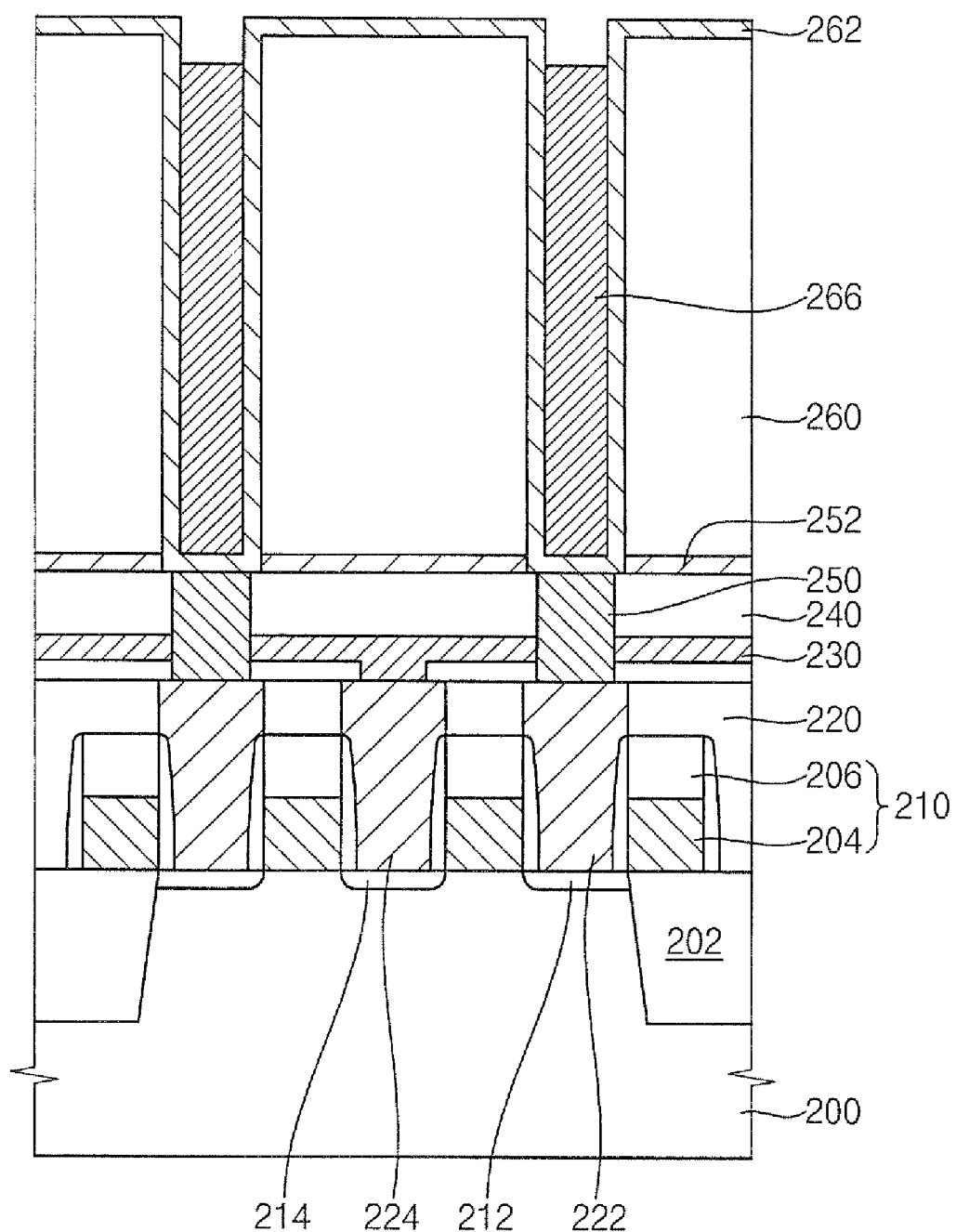

Referring to FIG. 13, an upper portion of the buffer layer 264 is removed through a first developing process using a developing solution. As a result, a first buffer layer pattern (not shown) is formed in the opening 255. The developing solution may include hydroxyl tetramethylammonium and water.

Thereafter, the first buffer layer pattern is baked. Thus, the first polymers in the first buffer layer pattern are cross-linked to form a second buffer layer pattern 266. For example, the first buffer layer pattern may be cured at a temperature of about 150° C. to about 250° C. to form the second buffer layer pattern 266. The temperature may be preferably 200° C. to 250° C. and more preferably 220° C. to 250° C. The second buffer layer pattern 266 is not dissolved through a subsequent cleaning process since the second buffer layer pattern 266 is insoluble in an LAL solution, isopropyl alcohol, water, or the like. The first polymer is substantially the same as the above-explained first polymer. Thus, any further explanations will be omitted.

Figure 14:
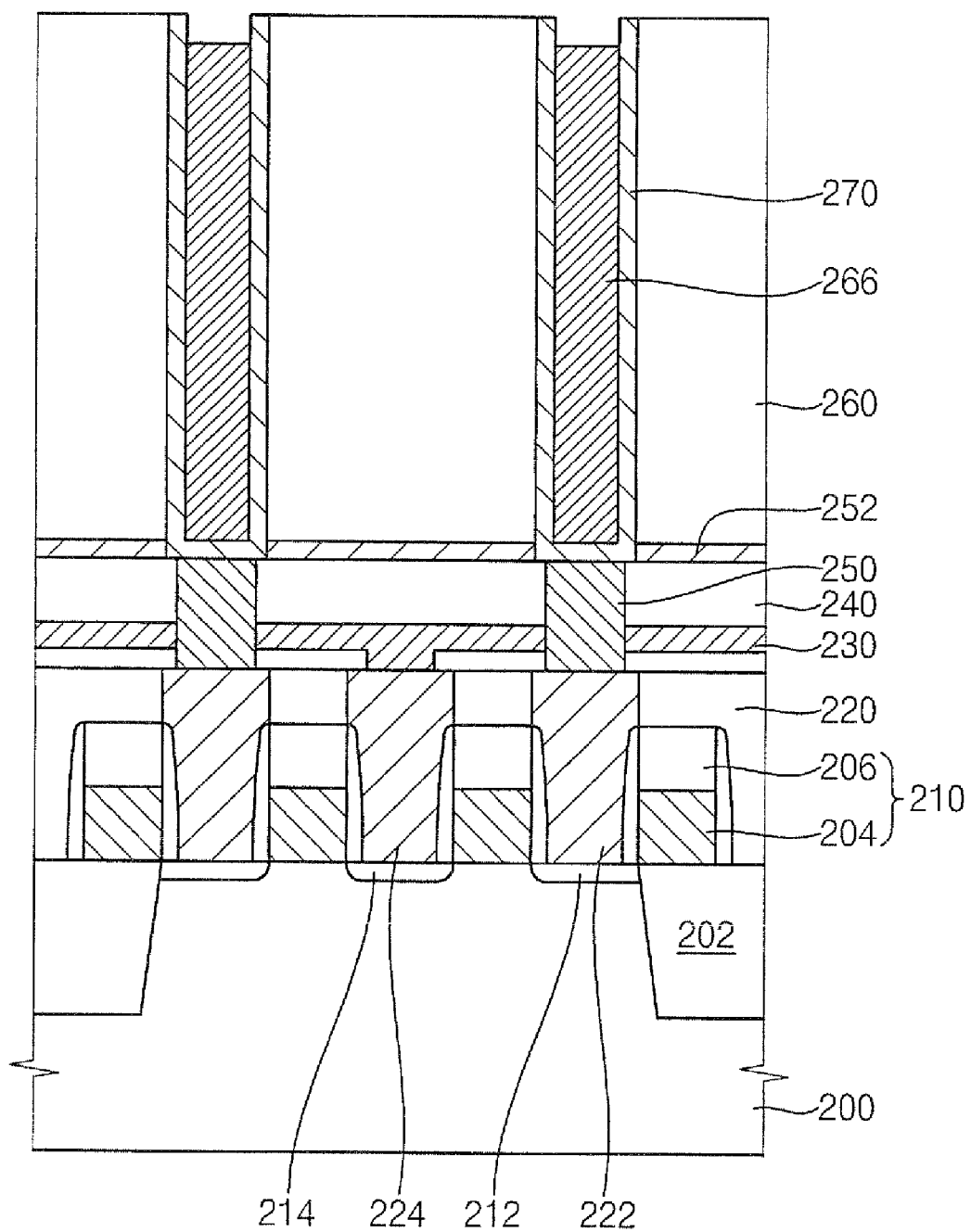

Referring to FIG. 14, the conductive layer 262 disposed on the mold layer 260 is removed to form a lower electrode 270.

For example, the conductive layer 262 is etched by using the second buffer layer pattern 266 as an etching mask to expose an upper surface of the mold layer 260. Thus, the lower electrode 270 making contact with a sidewall surrounding the opening 255 and having a cylindrical shape is formed. The second buffer layer pattern 266 remains in a cylinder of the lower electrode 270, and an outer sidewall of the lower electrode 270 is surrounded by the mold layer 260.

Figure 15:
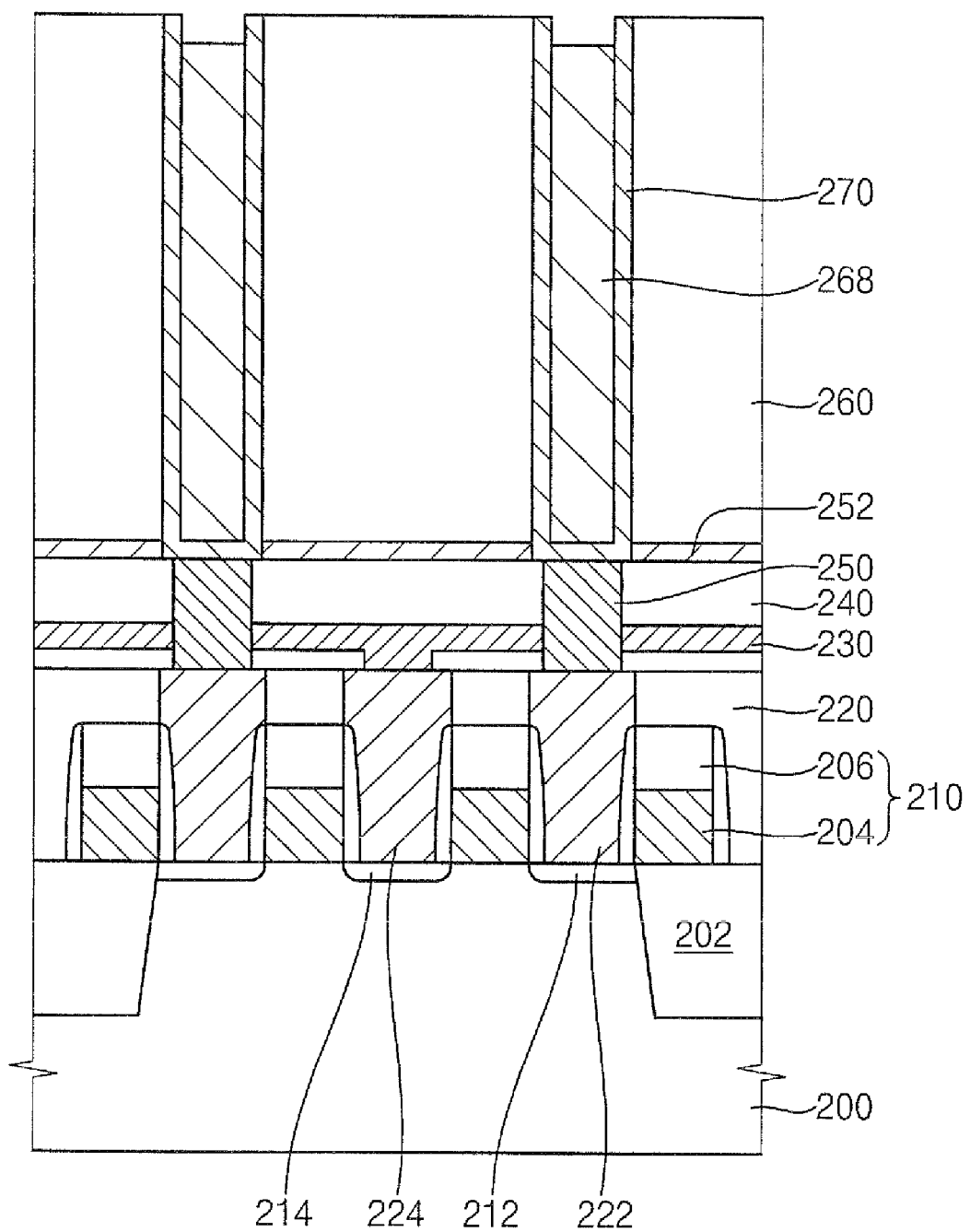

Referring to FIG. 15, an exposing process is performed to form a third buffer layer pattern 268 including a second polymer having the repeating unit of anthracene-methyl methacrylate and a repeating unit of hydroxyl-vinyl benzene. The second polymer may be represented by following Chemical Formula 2. The second polymer is substantially the same as the above-explained second polymer. Thus, any further explanation will be omitted.

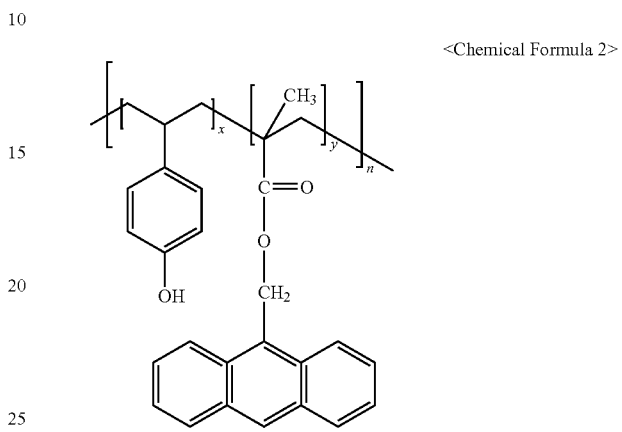

<Chemical Formula 2>

Figure 16:
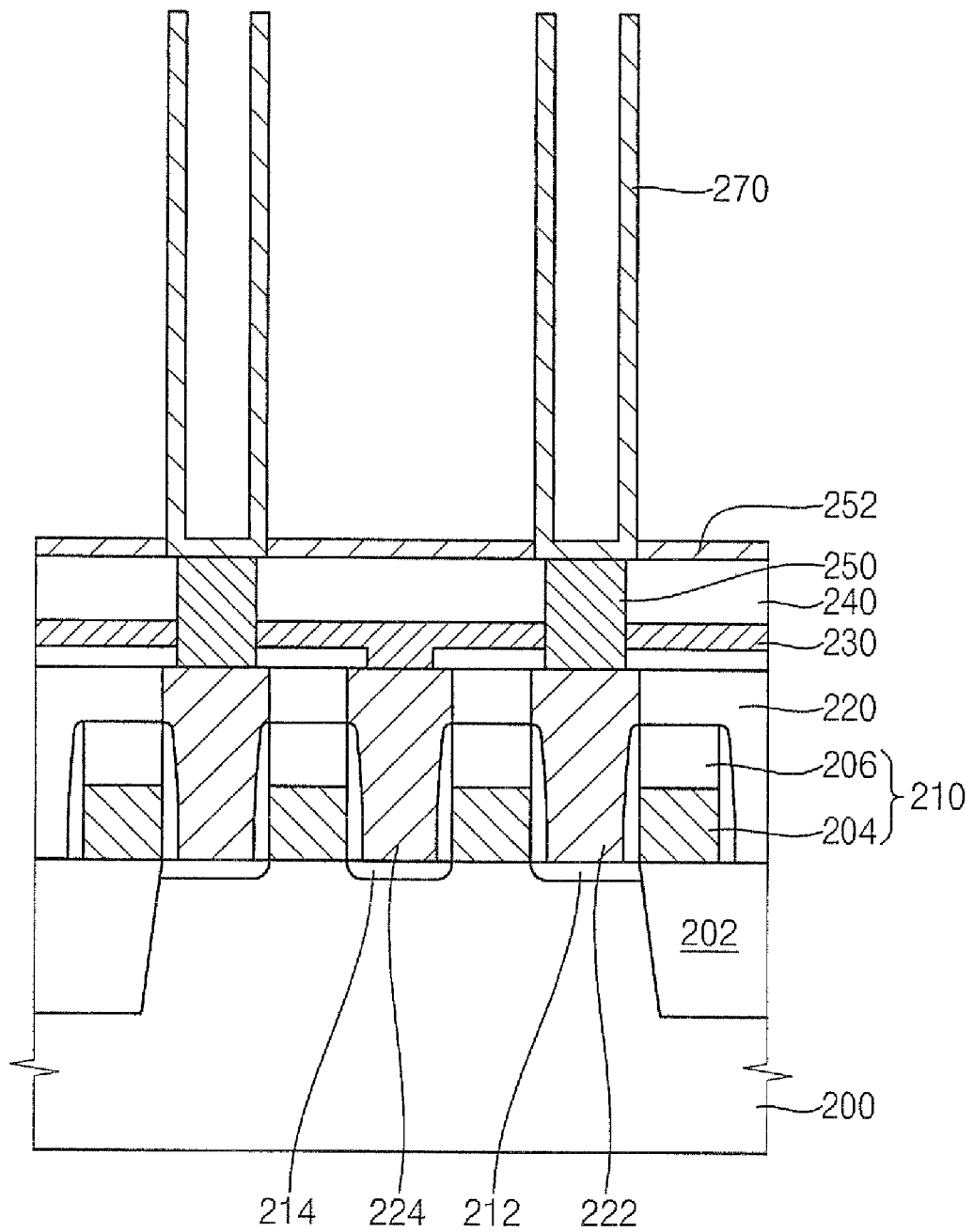

Referring to FIG. 16, the mold layer 260 is removed through a wet-etching process using an etching solution. When the mold layer 260 includes silicon oxide, examples of the etching solution may include an LAL solution including water, hydrofluoric acid, or ammonium hydrofluoride. The LAL solution may further include a metal corrosion inhibitor and a surfactant so as to prevent corrosion of the lower electrode and to prevent adsorption of an oxide.

Thereafter, the third buffer layer pattern 268 is removed through a second developing process using a developing solution. Since the buffer layer pattern 268 is soluble in the developing solution, the buffer layer pattern 268 may be easily removed. The developing solution may include hydroxyl tetramethylammonium and water.

Figure 17:
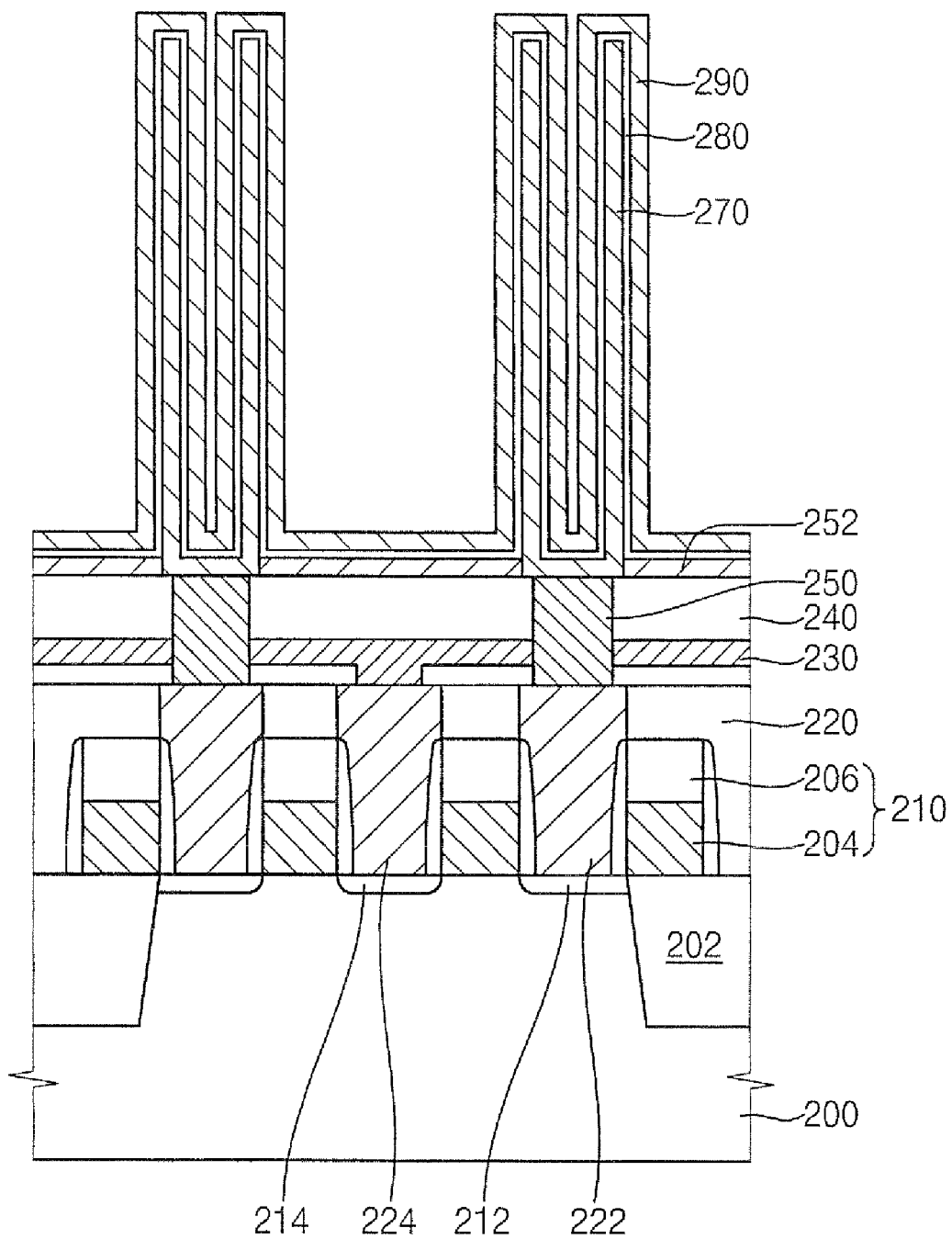

Referring to FIG. 17, a dielectric layer 280 having a uniform thickness is formed on the lower electrode 270. For example, a metal oxide having a relatively high dielectric constant may be deposited through a vapor deposition method to form the dielectric layer 280. Examples of the metal oxide may include aluminum oxide, hafnium oxide, or the like.

Thereafter, an upper electrode 290 is formed on the dielectric layer 280. The upper electrode 290 may include a metal, a material containing a metal, or the like. Alternatively, after a metal or a material containing a metal is deposited to form a lower layer, polysilicon may be deposited on the lower layer to form the upper electrode 290 having a multiple-layered structure. A DRAM device is completed through the above-mentioned processes.

Synthetic Example of Polymer

Tetrahydrofuran (manufactured by Shiny Co., Taiwan) as a solvent was added into a 1,000 ml flask on which a reflux condenser and a stirrer were set up. Tetrahydrofuran in the flask was stirred so that the temperature was increased by about 80° C. Butoxyl-vinyl benzene and anthracene-methyl methacrylate in a mole ratio of about 1:1 was inserted into the flask while the tetrahydrofuran in the flask was stirred with the temperature maintained. The mixture was reacted for about 6 hours with the temperature maintained to prepare a water-soluble polymer that may be represented by the following Chemical Formula 3. As a result of measuring the polymer by using a gel permission chromatography (GPC) method, the polystyrene-reduced weight average molecular weight of the polymer was about 8,000. Furthermore, the number average molecular weight of the polymer was about 4,500, and the solid content of the polymer was about 78% by weight (dried for about 3 hours at about 150° C.). A content of the repeating unit of butoxyvinyl benzene was about 45% by mole, and a content of the repeating unit of anthracene-methyl methacrylate was about 55% by mole. In Chemical Formula 3, a ratio of x:y is about 1:08 to about 1:1.2, R represents a tert-butyl group.

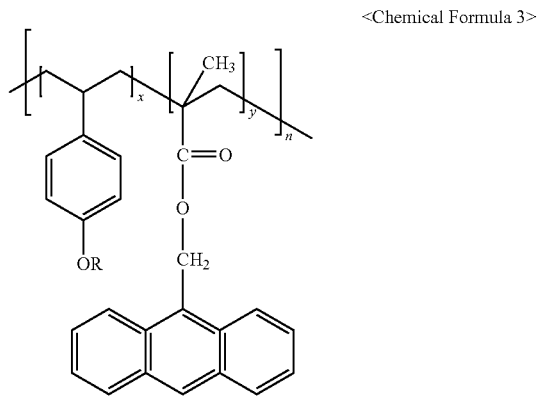

<Chemical Formula 3>

Preparation Example of a Composition for a Buffer Layer

About 3% by weight of the solid polymer prepared through Synthetic Example, about 0.05% by weight of ethylene lauryl ether as a surfactant, about 0.001% by weight of melamine resin as a cross-linking agent and a remainder of a solvent were mixed and stirred to prepare a composition for a buffer layer. The solvent included propylene glycol monomethylether acetate and propylene glycol monomethylether in a weight ratio of about 8:2.

According to the above, the buffer layer including the first polymer is partially removed using the developing solution to form the first buffer layer pattern. The first buffer layer pattern is changed to the second buffer layer pattern having an etching resistance through the baking process. Furthermore, after the second buffer layer pattern is used as an etching mask, the second buffer layer pattern may be changed to the third buffer layer pattern soluble in the developing solution through an exposing process. Accordingly, the third buffer layer pattern may be entirely removed without an ashing process. Thus, the method of forming a pattern may simplify manufacturing processes for a capacitor and a semiconductor device, and may improve their efficiencies.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a pattern, the method comprising:
   forming a conductive layer on a mold layer having an opening;
   forming a first buffer layer pattern on the conductive layer to fill the opening, the first buffer layer pattern including a polymer having a repeating unit of anthracene-methyl methacrylate and a repeating unit of alkoxyl-vinyl benzene;
   baking the first buffer layer pattern to cross-link the polymers and to form a second buffer layer pattern that is insoluble in a developing solution; and
   selectively removing the conductive layer on a top portion of the mold layer by using the second buffer layer pattern as an etching mask.

2. The method of claim 1, wherein the polymer has a linear shape and a number average molecular weight of about 3,000 to about 6,000.

3. The method of claim 1, wherein the polymer includes about 45% to about 55% by mole of the repeating unit of anthracene-methyl methacrylate and about 55% to about 45% by mole of the repeating unit of alkoxyl-vinyl benzene.

4. The method of claim 1, wherein the polymer is represented by Chemical Formula 1, wherein R represents an alkyl group having carbon atoms of 1 to 5, a ratio of y:x is about 1:0.8 to about 1:1.2, and n is a natural number:

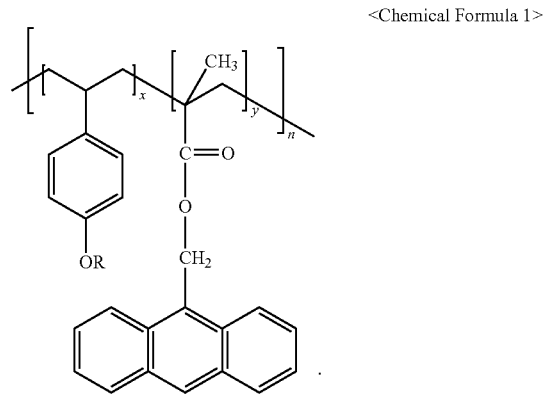

<Chemical Formula 1>

5. The method of claim 1, wherein forming the first buffer layer pattern comprises:
   forming a buffer layer on the conductive layer to fill the opening and to cover the conductive layer on the top portion of the mold layer; and
   partially removing an upper portion of the buffer layer by using a developing solution.

6. The method of claim 5, wherein the buffer layer is formed by spin coating with a composition including about 2% to about 6% by weight of the polymer, about 0.001% to about 0.1% by weight of a non-ionic polyoxyethylene surfactant, about 0.001% to about 0.1% by weight of a cross-linking agent, and a remainder of an organic solvent.

7. The method of claim 5, wherein the developing solution comprises tetramethylammonium hydroxide and water.

8. The method of claim 1, wherein the second buffer layer pattern is formed by cross-linking the polymer at a temperature of about 150° C. to about 250° C.

9. The method of claim 1, further comprising:
exposing the second buffer layer pattern to light to convert the second buffer layer pattern into a third buffer layer pattern soluble in a developing solution; and
removing the third buffer layer pattern.

10. A method of forming a capacitor, the method comprising:
forming a mold layer on a substrate, the mold layer having an opening that exposes a conductive pattern formed on the substrate;
forming a conductive layer on the mold layer and on a bottom and sidewalls of the opening;
forming a first buffer layer pattern on the conductive layer to fill the opening, the first buffer layer pattern including a first polymer having a repeating unit of anthracene-methyl methacrylate and a repeating unit of alkoxyl-vinyl benzene;
baking the first buffer layer pattern to cross-link the first polymers and to form a second buffer layer pattern that is insoluble in a developing solution;
selectively etching the conductive layer on a top portion of the mold layer by using the second buffer layer pattern as an etching mask to form a lower electrode electrically connected to the conductive pattern;
removing the mold layer;
exposing the second buffer layer pattern to light to convert the second buffer layer into a third buffer layer pattern including a second polymer having the repeating unit of anthracene-methyl methacrylate and a repeating unit of hydroxyl-vinyl benzene;
removing the third buffer layer pattern by using a developing solution;
forming a dielectric layer on the substrate having the lower electrode; and
forming an upper electrode on the dielectric layer.

11. The method of claim 10, wherein the first polymer is represented by Chemical Formula 1, wherein R represents an alkyl group having carbon atoms of 1 to 5, a ratio of y:x is about 1:0.8 to about 1:1.2, and n is a natural number:

<Chemical Formula 1>

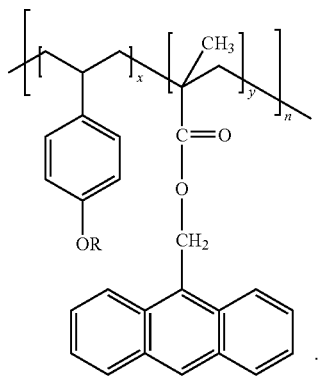

12. The method of claim 10, wherein the second polymer is represented by Chemical Formula 2, wherein a ratio of y:x is about 1:0.8 to about 1:2, and n is a natural number:

<Chemical Formula 2>

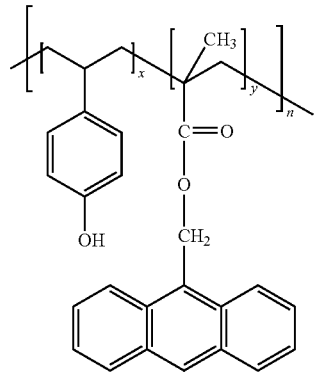

13. The method of claim 10, wherein forming the first buffer layer pattern comprises:
forming a buffer layer on the conductive layer to fill the opening and to cover the top portion of the mold layer; and
partially removing an upper portion of the buffer layer by using a developing solution.

14. The method of claim 13, wherein the buffer layer is formed by spin coating with a composition including about 2% to about 6% by weight of the polymer, about 0.001% to about 0.1% by weight of a non-ionic polyoxyethylene surfactant, about 0.001% to about 0.1% by weight of a cross-linking agent, and a remainder of an organic solvent.

15. The method of claim 10, wherein the repeating unit of anthracene-methyl methacrylate comprises (anthracene-9-yl)methyl methacrylate, and the repeating unit of alkoxyl-vinyl benzene comprises 1-tert-butoxy-4-vinylbenzene.

16. The method of claim 10, wherein the conductive layer comprises at least one selected from the group consisting of polysilicon, tungsten, titanium, tungsten nitride, or titanium nitride.

17. The method of claim 10, further comprising forming an etch stop layer between the mold layer and the substrate, the etch stop layer removed from the bottom of the opening prior to forming the conductive layer on the mold layer.

18. A method of forming a lower electrode of a semiconductor device, the method comprising:
providing a substrate having a contact pad exposed on a top surface of the substrate, the contact pad electrically connected to an active region of the substrate;
forming a mold layer on a substrate;
etching the mold layer to form an opening exposing the contact pad;
forming a conductive layer on the mold layer and exposed contact pad, the conductive layer formed to cover a bottom and sidewalls of the opening in the mold layer;
forming a first buffer layer pattern on the conductive layer to fill the opening, the first buffer layer pattern including a polymer having a repeating unit of anthracene-methyl methacrylate and a repeating unit of alkoxyl-vinyl benzene;

baking the first buffer layer pattern to cross-link the polymers and to form a second buffer layer pattern that is insoluble in a developing solution;

selectively removing the conductive layer on a top portion of the mold layer by using the second buffer layer pattern as an etching mask;

removing the mold layer; and removing the second buffer pattern by exposing and developing the second buffer pattern.

19. The method of claim 18, wherein the polymer includes about 45% to about 55% by mole of the repeating unit of anthracene-methyl methacrylate and about 55% to about 45% by mole of the repeating unit of alkoxyl-vinyl benzene.

20. The method of claim 18, wherein the polymer is represented by Chemical Formula 1, wherein R represents an alkyl group having carbon atoms of 1 to 5, a ratio of y:x is about 1:0.8 to about 1:1.2, and n is a natural number:

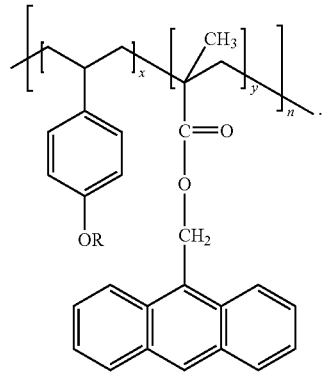

<Chemical Formula 1>

* * * * *